(12) United States Patent
Vezyrtzis et al.

(10) Patent No.: US 11,671,079 B1
(45) Date of Patent: Jun. 6, 2023

(54) SYSTEMS AND METHODS FOR CONCURRENTLY DRIVING CLOCK PULSE AND CLOCK PULSE COMPLEMENT SIGNALS IN LATCHES OF AN APPLICATION-SPECIFIC INTEGRATED CIRCUIT

(71) Applicant: Bitmain Development Inc., Dover, DE (US)

(72) Inventors: Christos Vezyrtzis, San Jose, CA (US); Peter Holm, Seattle, WA (US); Stephen M. Beccue, Frazier Park, CA (US)

(73) Assignee: Bitmain Development Inc., Dover, DE (US)

( * ) Notice: Subject to any disclaimer, the term of this patent is extended or adjusted under 35 U.S.C. 154(b) by 0 days.

(21) Appl. No.: 17/528,602

(22) Filed: Nov. 17, 2021

(51) Int. Cl.
| | |
|---|---|
| *H03K 3/00* | (2006.01) |
| *H03K 3/037* | (2006.01) |
| *H03K 19/20* | (2006.01) |
| *G11C 19/28* | (2006.01) |
| *G06F 1/10* | (2006.01) |
| *H03K 5/01* | (2006.01) |
| *H03K 5/00* | (2006.01) |

(52) U.S. Cl.
CPC ............ *H03K 3/037* (2013.01); *G06F 1/10* (2013.01); *G11C 19/28* (2013.01); *H03K 5/01* (2013.01); *H03K 19/20* (2013.01); *H03K 2005/00013* (2013.01)

(58) Field of Classification Search
CPC ......... H03K 3/037; H03K 5/01; H03K 19/20; H03K 2005/00013; G06F 1/10; G11C 19/28

USPC .......................................................... 327/199
See application file for complete search history.

(56) References Cited

U.S. PATENT DOCUMENTS

| | | | | |
|---|---|---|---|---|
| 6,023,260 | A * | 2/2000 | Higashi ............... | G09G 3/3648 345/98 |
| 6,476,790 | B1 * | 11/2002 | Tanaka ................. | G09G 3/3688 345/98 |
| 6,710,761 | B2 * | 3/2004 | Tanaka ................. | G09G 3/3688 345/98 |
| 7,154,319 | B2 * | 12/2006 | Kim .................. | H03K 3/356121 327/202 |
| 7,342,565 | B2 * | 3/2008 | Tanaka ................. | G09G 3/3688 345/99 |
| 7,719,325 | B1 * | 5/2010 | Wang .................. | H03K 17/162 327/112 |
| 7,800,423 | B2 * | 9/2010 | Kim .................... | H03K 5/1565 327/175 |
| 8,823,433 | B2 * | 9/2014 | Cha ....................... | H03K 3/011 327/175 |
| 9,275,588 | B2 * | 3/2016 | Higashi ................ | G09G 3/2011 |
| 9,612,614 | B2 * | 4/2017 | Bucelot .................. | H03K 5/159 |
| 9,618,966 | B2 * | 4/2017 | Bucelot .................... | G06F 1/10 |
| 10,367,493 | B1 * | 7/2019 | Addepalli ............ | H03L 7/0891 |

(Continued)

*Primary Examiner* — Ryan Jager
(74) *Attorney, Agent, or Firm* — Jon E. Gordon; Haug Partners LLP

(57) ABSTRACT

Embodiments of the present invention provide for a core stage in an application-specific integrated circuit core which drives both a clock pulse signal and a clock pulse negative/complement signal concurrently, thereby resulting in perfectly aligned signals. The core stage can include a pulse generator, a clock distribution circuit, and a set of latches.

11 Claims, 8 Drawing Sheets

(56) References Cited

U.S. PATENT DOCUMENTS

| | | | | |
|---|---|---|---|---|
| 2014/0061442 A1* | 3/2014 | Denham | ............ | H04N 5/37455 377/54 |
| 2015/0262703 A1* | 9/2015 | Murakami | ........... | G09G 3/3677 377/64 |
| 2015/0279480 A1* | 10/2015 | Murakami | ........... | G09G 3/3677 345/100 |

* cited by examiner

SYSTEMS AND METHODS FOR CONCURRENTLY DRIVING CLOCK PULSE AND CLOCK PULSE COMPLEMENT SIGNALS IN LATCHES OF AN APPLICATION-SPECIFIC INTEGRATED CIRCUIT

BACKGROUND

A shift register can be implemented as a chain of latches, where Q1=D2, Q2=D3, etc., and where data moves one latch at a time per clock cycle. In this regard, the latches in the shift register cannot share the same clock pulse. Instead, shift registers use a reverse clock propagation. This guarantees that clock pulses of different stages do not overlap, e.g., in order to avoid hold violations (i.e., data running through multiple stages at once). Reverse clock propagation can be achieved with causal pulse generators, in which a particular clock pulse does not start until a preceding pulse is finished.

As depicted in FIG. 1, an application-specific integrated circuit (ASIC) core can include a plurality of core stages, with each core stage having its own pulse generator (PG), e.g., in order to create non-overlapping clock pulses (CP) between the core stages, and clock distribution (CD) circuit, e.g., to distribute the CP to the many latches of each stage. In general, only CP is distributed to the latches. However, latches need both CP and clock pulse negative/complement (CPN) signals. As such, each group of latches (e.g., 32 latches per group) can use a local inverter to generate CPN, as depicted in FIG. 2.

However, using a local inverter in each latch group to generate CPN has a number of drawbacks. For example, with regard to timing, CP/CPN are not aligned and, therefore, a wider CP pulse is needed for the latch to work correctly. Further, due to on-chip variation, different groups of inverters are faster/slower and, therefore, a wider CP pulse is needed for all the latch groups to work correctly. Further, the CP/CPN of consecutive stages are not aligned and, therefore, more pulse spacing is needed to protect for hold violations. As a result of the above, the ASIC core frequency degrades.

Accordingly, it would be desirable to have systems and methods that reduce the time wasted as a result of the local inverter within each latch group.

BRIEF SUMMARY OF THE INVENTION

Embodiments of the invention relate to a core stage in an ASIC core which drives both the CP and the CPN signals concurrently. As such, the CP and CPN signals are perfectly aligned, without causing any timing degradation.

According to an embodiment, an ASIC core can include a plurality of core stages. In this regard, each core stage can include a pulse generator, a clock distribution circuit, and a set of latches. The pulse generator is configured to (i) receive a clock pulse input and a plurality of digital inputs and (ii) generate a clock pulse output based on the received clock pulse input and the digital inputs. The clock distribution circuit is configured to receive the clock pulse output and generate a clock pulse signal and a clock pulse complement signal concurrently based on the received clock pulse output. The set of latches is configured to receive the clock pulse signal and the clock pulse complement signal.

According to an embodiment, each of the pulse generators are connected in cascade and implement reverse and non-overlapping clock pulses.

According to an embodiment, the clock pulse signals and the clock pulse complement signals of adjacent core stages do not overlap.

According to an embodiment, each of the pulse generators comprises: a state element, a logic AND gate, and a first delay element.

According to an embodiment, the first delay element comprises: a plurality of inverters and a multiplexer.

According to an embodiment, the clock distribution circuit comprises: a first inverter, a second inverter, a positive current feedback (PCFB) circuit, and a negative current feedback (NCFB) circuit.

According to an embodiment, the first inverter comprises a first p-channel metal-oxide semiconductor (PMOS) transistor and a first re-channel metal-oxide semiconductor (NMOS) transistor; and wherein the second inverter comprises a second PMOS transistor and a second NMOS transistor.

According to an embodiment, the PCFB circuit comprises a transmission gate, a first logic NAND gate, and a first logic NOR gate; and wherein the NCFB circuit comprises a tri-state inverter, a second logic NAND gate, and a second logic NOR gate.

According to an embodiment, each of the set of latches comprises at least one transmission gate and a corresponding inverter.

According to an embodiment, the at least one transmission gate comprises a PMOS transistor and a NMOS transistor.

According to an embodiment, the clock pulse signal connects to a clock pulse port in the set of latches and the clock pulse negative signal connects to a clock pulse negative port in the set of latches.

According to an embodiment, the plurality of digital inputs are configured to set a pulse width of the clock pulse output.

BRIEF DESCRIPTION OF THE DRAWINGS

Some aspects of the disclosure are herein described, by way of example only, with reference to the accompanying drawings. With specific reference now to the drawings in detail, it is stressed that the particulars shown are by way of example and are for purposes of illustrative discussion of embodiments of the disclosure. In this regard, the description, taken with the drawings, makes apparent to those skilled in the art how aspects of the disclosure may be practiced.

DETAILED DESCRIPTION OF PREFERRED EMBODIMENTS

This description is not intended to be a detailed catalog of all the different ways in which the disclosure may be implemented, or all the features that may be added to the instant disclosure. For example, features illustrated with respect to one embodiment may be incorporated into other embodiments, and features illustrated with respect to a particular embodiment may be deleted from that embodiment. Thus, the disclosure contemplates that in some embodiments of the disclosure, any feature or combination of features set forth herein can be excluded or omitted. In addition, numerous variations and additions to the various embodiments suggested herein will be apparent to those skilled in the art in light of the instant disclosure, which do not depart from the instant disclosure. In other instances, well-known structures, interfaces, and processes have not been shown in detail in order not to unnecessarily obscure the invention. It is intended that no part of this specification be construed to affect a disavowal of any part of the full scope of the invention. Hence, the following descriptions are intended to illustrate some particular embodiments of the disclosure, and not to exhaustively specify all permutations, combinations and variations thereof.

Unless explicitly stated otherwise, the definition of any term herein is solely for identification and the reader's convenience; no such definition shall be taken to mean that any term is being given any meaning other than that commonly understood by one of ordinary skill in the art to which this disclosure belongs, unless the definition herein cannot reasonably be reconciled with that meaning. Further, in the absence of such explicit definition, all technical and scientific terms used herein have the same meaning as commonly understood by one of ordinary skill in the art to which this disclosure belongs. The terminology used in the description of the disclosure herein is for the purpose of describing particular embodiments only and is not intended to be limiting of the disclosure.

Figure 1:
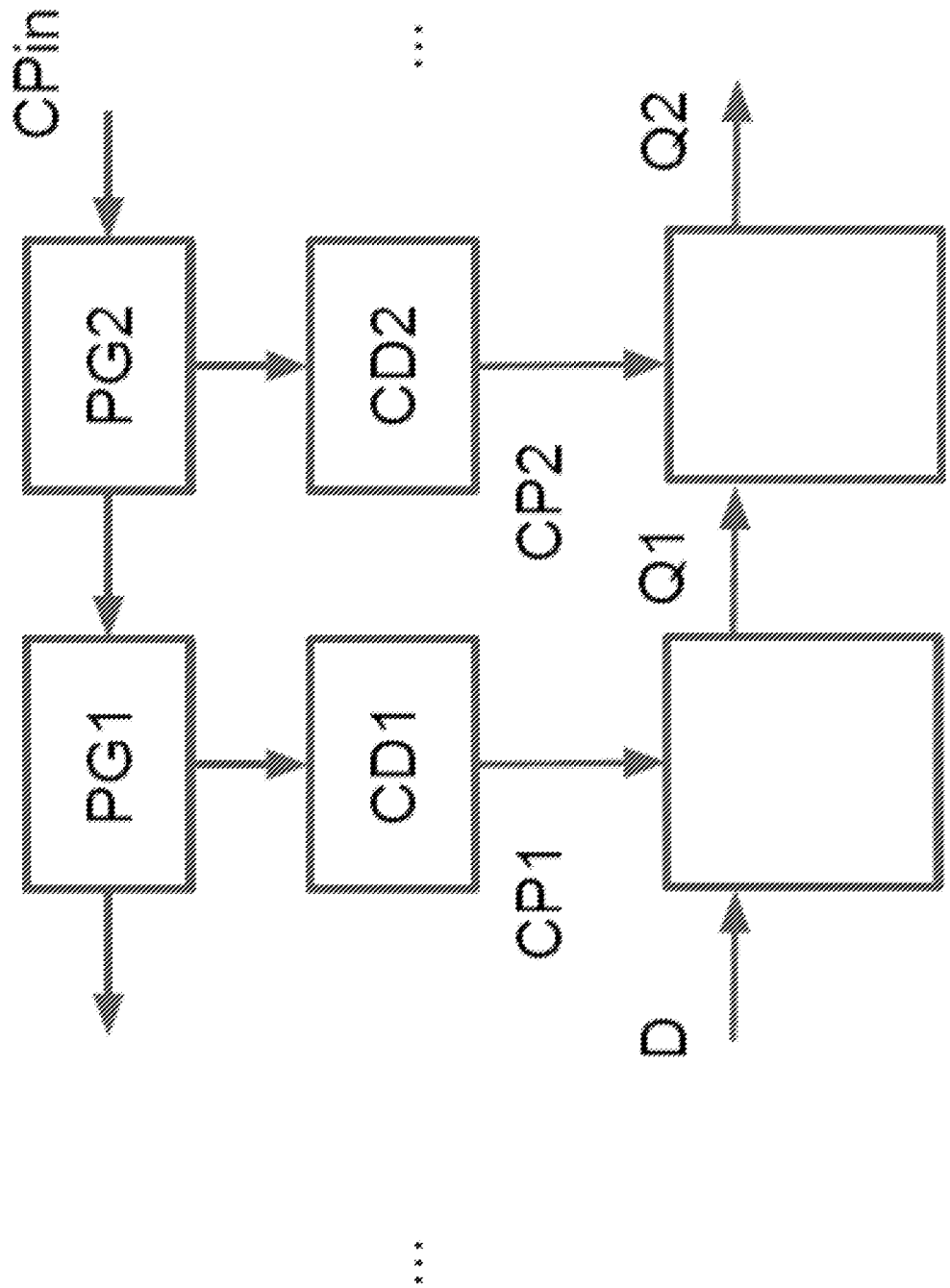
FIG. 1 depicts an application-specific integrated circuit core.
Figure 2:
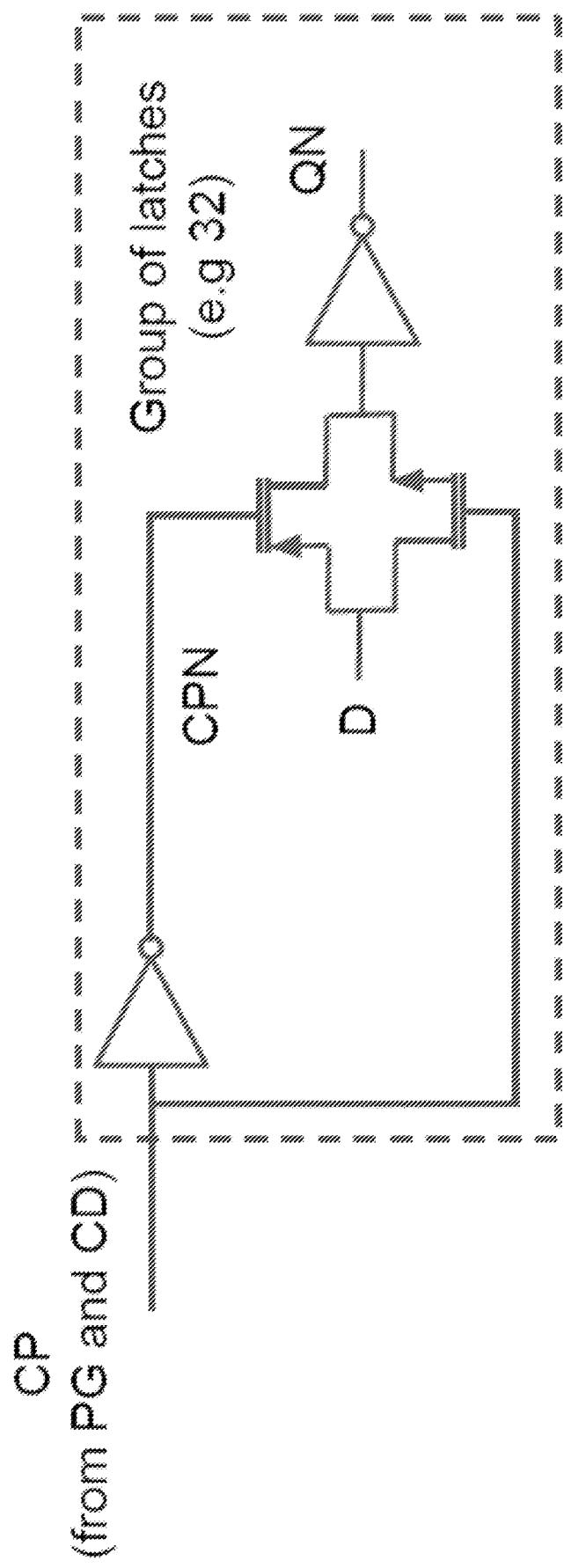
FIG. 2 depicts a local inverter within a latch group.
Figure 3A:
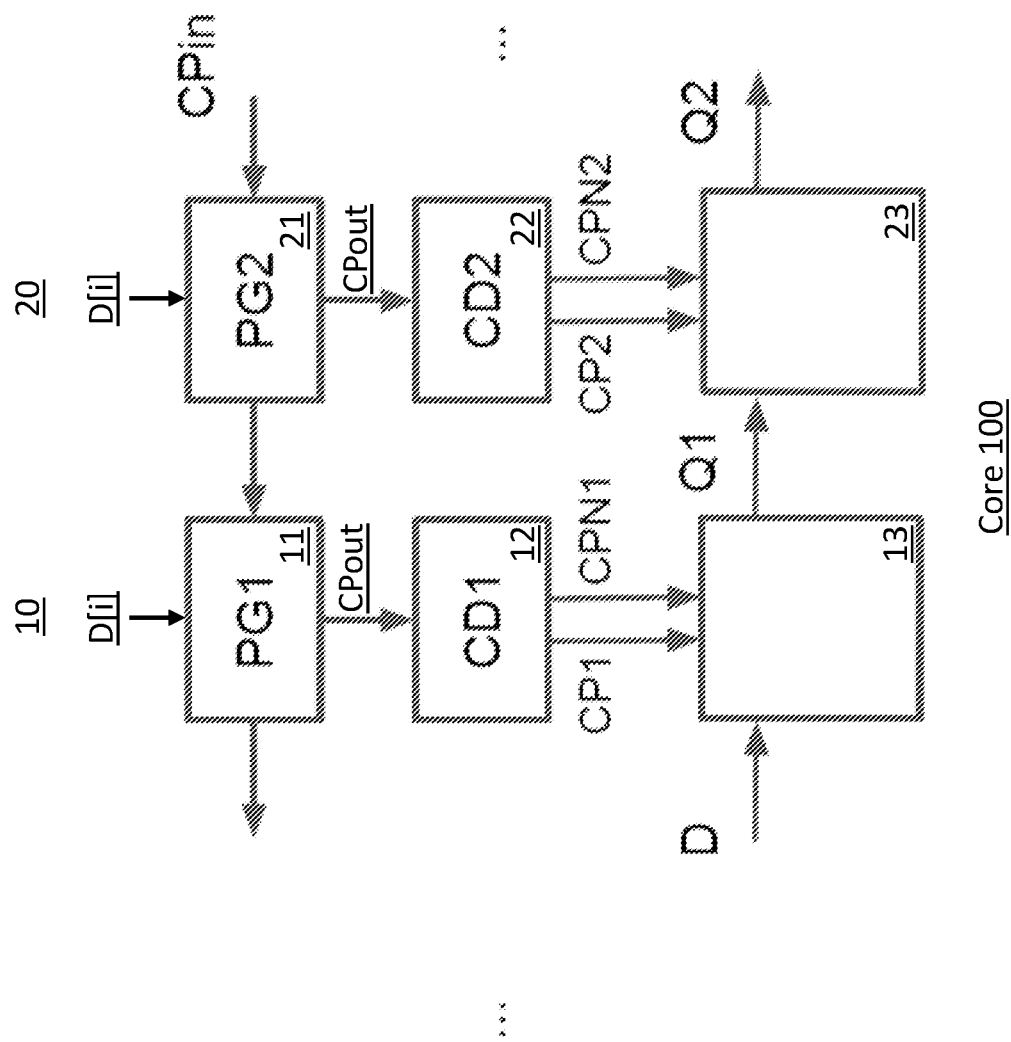
FIG. 3A depicts an exemplary application-specific integrated circuit core according to an embodiment of the invention.

FIG. 3A depicts an exemplary application-specific integrated circuit core according to an embodiment of the invention. As depicted in the figure, an application-specific integrated circuit core 100 can include a plurality of core stages, e.g., a first core stage 10, a second core stage 20, etc. According to an embodiment, the first core stage 10 can include a first pulse generator 11 (e.g., PG1), a first clock distribution circuit 12 (e.g., CD1), and a first set of latches 13, where the first set of latches can include one or more latches. Further, the second core stage 20 can include a second pulse generator 21 (e.g., PG2), a second clock distribution circuit 22 (e.g., CD2), and a second set of latches 23, where the second set of latches can include one or more latches.

According to an embodiment, the first clock distribution circuit 12 and the second clock distribution circuit 22 are part of a clock distribution circuit network. The clock distribution circuit network can be a large digital buffer with a differential, dual-rail output.

According to an embodiment, as depicted in the figure, each pulse generator is configured to (i) receive, as inputs, a clock pulse input (CPin) and a plurality of digital "pulse width setting" inputs D[i] and (ii) generate a clock pulse output (CPout) based on the inputs. In this regard, the inputs D[i} are configured to set the pulse width of the CPout. Further, each of the pulse generators are connected in cascade in order to implement the reverse and non-overlapping clock pulses.

Figure 3B:
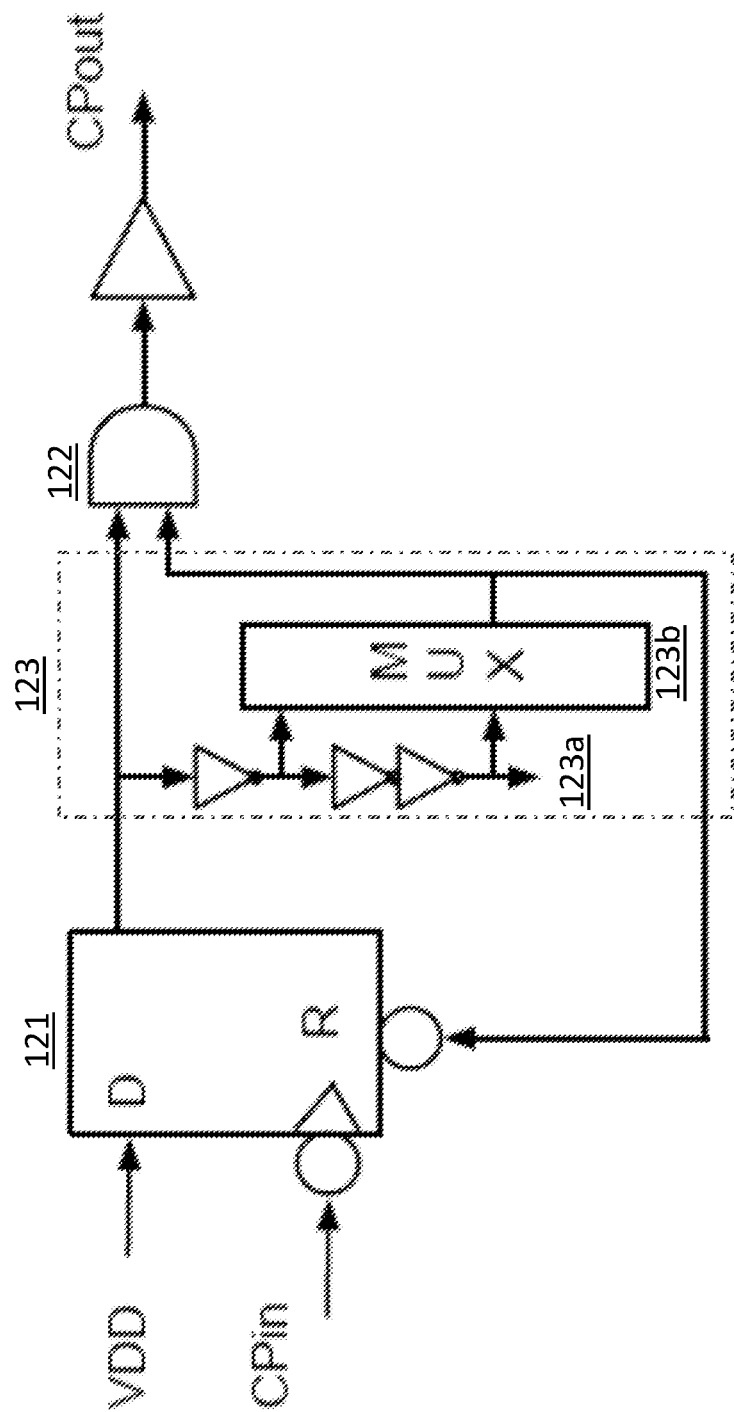
FIG. 3B depicts an exemplary pulse generator circuit according to an embodiment of the invention.

FIG. 3B depicts an exemplary pulse generator circuit according to an embodiment of the invention. According to an embodiment, each pulse generator 11/21 can include a state element 121, a logic AND gate 122, and a delay element 123. According to an embodiment, the state element 121 is a negative-edge triggered flip flop. Further, the delay element 123 can include a plurality of inverters 123a and a multiplexer 123b. According to an embodiment, the delay of the delay element 123 can be controlled by the inputs D[i]. As depicted in the figure, the delay element 123 is comprised of a chain of inverters. Further, one of the inverters receives, as an input, the output of the state element 121. Further, the chain of inverters is tapped off at various points in order to provide inputs to the multiplexer 123b, e.g., at the first inverter output, at the third inverter output, at the fifth inverter output, etc. Further, the multiplexer 123b also receives the inputs D[i], which are used to program the pulse output. In this regard, the multiplexer 123b selects one of the inputs D[i] in order to propagate a particular inverter output to the multiplexer 123b output. For example, if the inputs D[i] are comprised of 3 control bits and they are set to 000, the multiplexer 123b will select its first input (which is the delayed version of the state element 121 output by one inverter); if the inputs D[i] are set to 001, then the multiplexer 123 will select its second input (which is the delayed version of the state element 123 output by three inverters), etc.

The pulse generator 11/21 can operate as follows.

At an initial state, the state element 121, CPin, and CPout are all at "0." Further, a first input of the logic AND gate 122 is at "0" and a second input of the logic AND gate 122 is at "1" (since the state element 121 has a "0" output and the multiplexer 123b output is at "1"). In this regard, each of the inverter outputs of the delay element 123 are also at "1" (since the state element 121 output is "0."

Then, at some point in time, CPin arrives as a small pulse. After CPin completes its pulse, i.e., when it is transitioning from '1' to '0', it triggers the state element 121, which has a "1" hard-wired at its data port, to update its state. The state element now updates its state to a "1", and its output becomes "1." Accordingly, the logic AND gate 122 now has two "1"s at its inputs, since its top input was updated to a "1". According to an embodiment, the bottom input can be a delayed version of the top input's complement, so it remains at '1' temporarily since it hasn't had enough time to change. Further, because the logic AND gate 122 has both its inputs at "1", it changes its output to a "1" and, therefore, CPout becomes "1."

Then, the top input of the logic AND gate 122 starts going through the chain of inverters in the delay element 123. In this regard, each of the outputs of the chain of inverters become "0" after some delay.

The multiplexer 123b then receives the inverter output signals and the input D[i] signals. Based on the received D[i] signal, the multiplexer 123b selects one of the inverter output signals and propagates it to the multiplexer 123b output.

Eventually, the multiplexer 123b output will transition to a "0", depending on which of its inputs is selected by the input D[i] signals. The multiplexer 123b will present the logic AND gate 122 with a "0" at its bottom input, forcing the logic AND gate 122 output to "0", forcing CPout to go back to "0".

Further, according to an embodiment, the larger the value of the input D[i] signal (e.g., 001 instead of 000), the longer it takes for CPout to go back to "0". In this regard, because the larger values of the input D[i] signals correspond to a more-delayed version of the state element 121 output, it will take a longer time for the appropriate multiplexer 123b input to go to "0" and, therefore, it will also take more time for the multiplexer 123b output to go to "0" (which causes CPout to go to "0".)

According to an embodiment, each CPout is connected to a corresponding clock distribution circuit of the clock distribution circuit network, e.g., the large digital buffer with a differential, dual-rail output. In this regard, each clock distribution circuit generates two concurrent output signals, i.e., a clock pulse (CP) signal and a clock pulse negative/complement (CPN) signal. Further, because the digital buffer has very little open-circuit voltage, there is no margin needed in timing.

Figure 3C:
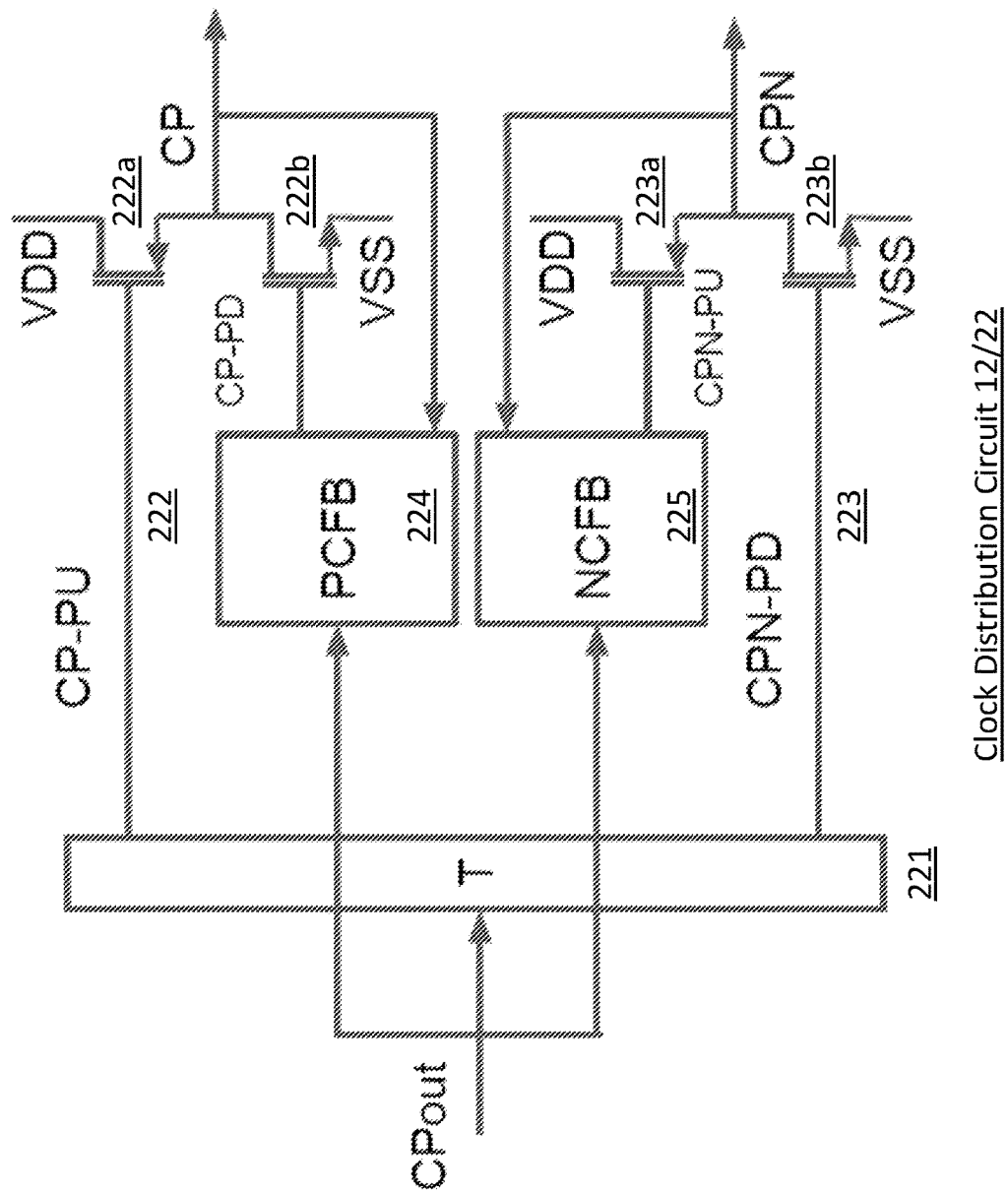
FIG. 3C depicts an exemplary clock distribution circuit according to an embodiment of the invention.

FIG. 3C depicts an exemplary clock distribution circuit according to an embodiment of the invention. As depicted in the figure, the clock distribution circuit 12/22 can include a master timing block 221 (T), a CP inverter 222, a CPN inverter 223, a PCFB circuit 224, and a NCFB circuit 225.

According to an embodiment, the PCFB circuit 224 is configured to create signals, e.g., CP-PU and CP-PD, in order to drive the CP inverter 222.

According to an embodiment, the master timing block 221, the PCFB circuit 224, and the NCFB circuit 225 are configured to have equal delays.

According to an embodiment, the CP inverter 222 is comprised of one PMOS transistor 222a and one NMOS transistor 222b. The PMOS transistor 222a has its source at VDD, its drain at the CP signal, and its gate is controlled by the master timing block 221 through the signal CP-PU. In this regard, the CP-PU signal (i) drives the PMOS transistor 222a to pull CP up and (ii) stops the CP pull-up after CP drive-high is done. The NMOS transistor 222b has its source at VSS, its drain at the CP signal, and its gate is controlled by the PCFB circuit 224 through the signal CP-PD. In this regard, the CP-PD signal (i) drives the NMOS transistor 222b to pull CP low and (ii) stops the CP pull-down after the CP drive-low is done.

According to an embodiment, the CPN inverter 223 is comprised of one PMOS transistor 223a and one NMOS transistor 223b. The NMOS transistor 223b has its source at VSS, its drain at the CPN signal, and its gate is controlled by the master timing block 221 through the signals CPN-PD. In this regard, the CPN-PD signal (i) drives the NMOS transistor 223b to pull CPN down and (ii) stops the CPN pull-down after the CPN drive-low is done. The PMOS transistor 223a has its source at VDD, its drain at the CPN signal, and its gate is controlled by the NCFB circuit 225 through the signal CPN-PU. In this regard, the CPN-PU signal (i) drives the PMOS transistor 223a to pull CPN up and (ii) stops the CPN pull-up after the CPN drive-high is done.

According to an embodiment, the PCFB circuit 224 receives two inputs, the CPout signal and the CP signal, and produces the signal CP-PD which in turn controls the NMOS transistor 222b of the CP inverter 222.

According to an embodiment, the NCFB circuit 225 receives two inputs, the CPout signal and the CPN signal, and produces the signal CPN-PU which in turn controls the PMOS 223a transistor of the CPN inverter 223.

According to an embodiment, the PMOS and NMOS transistors are matched in their construction.

Figure 4A:
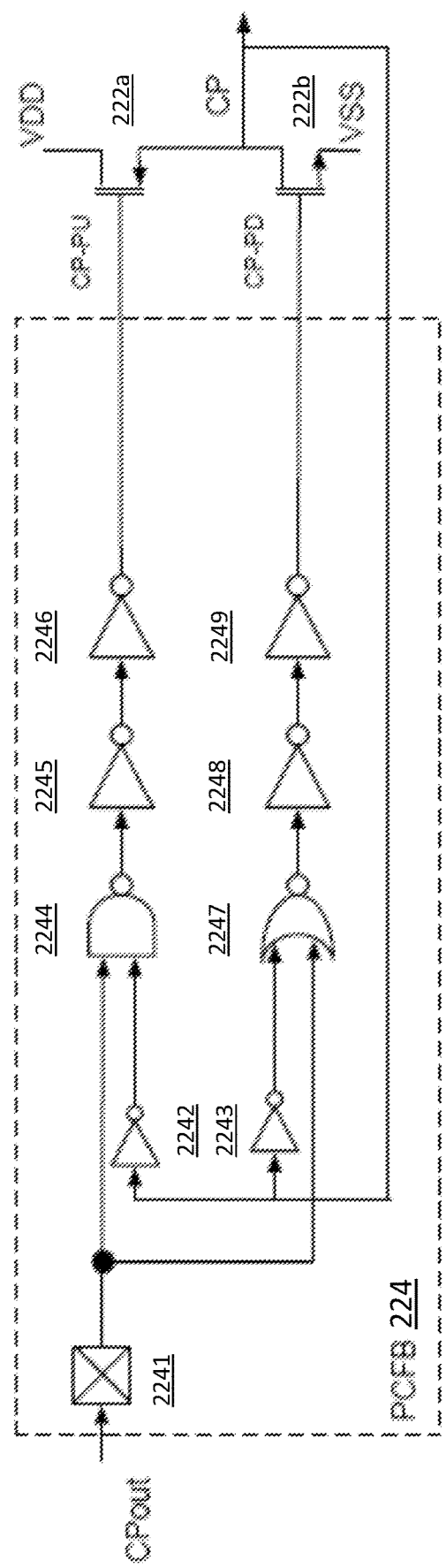
FIG. 4A depicts an exemplary positive current feedback circuit according to an embodiment of the invention.

FIG. 4A depicts an exemplary PCFB circuit according to an embodiment of the invention. As depicted in the figure, the PCFB circuit 224 can include a transmission gate 2241, inverters 2242, 2243, 2245, 2246, 2248, and 2249, a logic NAND gate 2244, and a logic NOR gate 2247. In this regard, the transmission gate 2241 receives CPout as an input and provides its output to the logic NAND gate 2244 and the logic NOR gate 2247. Further, the logic NAND gate 2244 and the logic NOR gate 2247 each receive an inverted version of the signal CP, e.g., via the inverters 2242 and 2243, respectively. Further, the output of the logic NAND gate 2244 feeds into inverters 2245 and 2246, the output of which is the signal CP-PU. Further, the output of the logic NOR gate 2247 feeds into inverters 2248 and 2249, the output of which is the signal CP-PD.

Figure 4B:
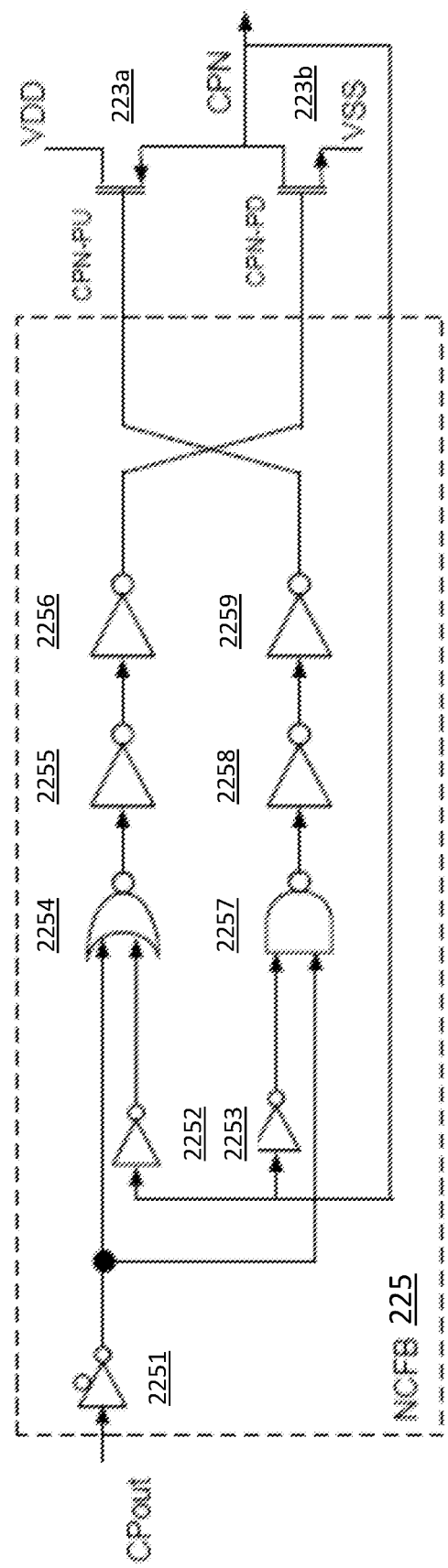
FIG. 4B depicts an exemplary negative current feedback circuit according to an embodiment of the invention.

FIG. 4B depicts an exemplary NCFB circuit according to an embodiment of the invention. As depicted in the figure, the NCFB circuit 225 can include a tri-state inverter 2251, inverters 2252, 2253, 2255, 2256, 2258, and 2259, a logic NOR gate 2254, and a logic NAND gate 2257. In this regard, the transmission gate tri-state inverter 2251 receives CPout as an input and provides its output to the logic NOR gate 2254 and the logic NAND gate 2257. According to an embodiment, the tri-state inverter 2251 has the same delay as the transmission gate 2241. Further, the logic NOR gate 2254 has the same delay as the logic NAND gate 2244. According to an embodiment, the logic NOR gate 2254 and the logic NAND gate 2257 each receive an inverted version of the signal CPN, e.g., via the inverters 2252 and 2253, respectively. Further, the output of the logic NOR gate 2254 feeds into inverters 2255 and 2256, the output of which is the signal CPN-PD. Further, the output of the logic NAND gate 2257 feeds into inverters 2258 and 2259, the output of which is the signal CPN-PU.

According to an embodiment, the operation of the PCFB circuit 224 and the NCFB circuit 225 is as follows. At an initial state, CPout is at "0", CP is at "0", CP-PU is at "VDD", CP-PD is at "0", CPN is at "VDD", CPN-PU is at "VDD", and CPN-PD is at "0".

In order to drive CP high, CPout first transitions from "0" to "VDD". CPout is then provided to the transmission gate 2241. The output of the transmission gate 2241 is then provided to an input of the logic NAND gate 2244 (other NAND input is at VDD since CP is at "0"—so its complement is at VDD), the output of which transitions from VDD to 0. The output of the logic NAND gate 2244 is then provided to the inverter 2245 (the output of which transitions form "0" to "VDD"). The output of the inverter 2245 is then provided to the inverter 2246 (the output of which is the CP-PU signal, which transitions from "VDD" to "0"). The transistor 222a then starts charging CP from "0" to "VDD". In this regard, when the charging is complete, the output of the inverter 2242 transitions from "VDD" to "0". Accordingly, because the bottom input of the logic NAND gate 2244 is now at "0", the output of the logic NAND gate 2244 transitions from "0" to "VDD". Then, after the output signal traverses inverters 2245 and 2246, the resulting CP-PU signal transitions from "0" to "VDD", thereby releasing the transistor 222a and completing the CP high phase.

In order to drive CP low, CPout first transitions from "VDD" to "0". CPout is then provided to the transmission gate 2241. The output of the transmission gate 2241 is then provided to the logic NOR gate 2247 (other NOR input is at "0" since CP is at "VDD"—so its complement is at "0"), the output of which transitions from "0" to "VDD". The output of the logic NOR gate 2247 is then provided to the inverter 2248 (the output of which transitions form "VDD" to "0"). The output of the inverter 2248 is then provided to the inverter 2249 (the output of which is the CP-PD signal, which transitions from "0" to "VDD"). The transistor 222b then starts discharging CP from "VDD" to "0". In this regard, when the discharging is complete, the output of the inverter 2243 transitions from "0" to "VDD". Accordingly, because the top input of the logic NOR gate 2247 is now at "VDD", the output of the logic NOR gate 2247 transitions from "VDD" to "0". Then, after the output signal traverses inverters 2248 and 2249, the resulting CP-PD signal transitions from "VDD" to "0", thereby releasing the transistor 222b and completing the CP low phase.

In order to drive CPN low, CPout first transitions from "0" to "VDD". CPout is then provided to the tri-state inverter 2251, the output of which transitions from "VDD" to "0". The output of the tri-state inverter 2251 is then provided to the logic NOR gate 2254 (other NOR input is at "0" since CPN is at "VDD"—so its complement is at "0"), the output of which transitions from "0" to "VDD". The output of the logic NOR gate 2254 is then provided to the inverter 2255 (the output of which transitions form "VDD" to "0"). The output of the inverter 2255 is then provided to the inverter 2256 (the output of which is the CPN-PD signal, which transitions from "0" to "VDD"). The transistor 223b then starts discharging CP from "VDD" to "0". In this regard, when the discharging is complete, the output of the inverter 2252 transitions from "0" to "VDD". Accordingly, because the bottom input of the logic NOR gate 2254 is now at "VDD", the output of the logic NOR gate 2254 transitions from "VDD" to "0". Then, after the output signal traverses inverters 2255 and 2256, the resulting CPN-PD signal transitions from "VDD" to "0", thereby releasing the transistor 223b and completing the CPN low phase.

In order to drive CPN high, CPout first transitions from "VDD" to "0". CPout is then provided to the tri-state inverter 2251, the output of which transitions from "0" to "VDD". The output of the tri-state inverter 2251 is then provided to an input of the logic NAND gate 2257 (other NAND input is at "VDD" since CP is at "0"—so its complement is at "VDD"), the output of which transitions from VDD to 0. The output of the logic NAND gate 2257 is then provided to the inverter 2258 (the output of which transitions form "0" to "VDD"). The output of the inverter 2258 is then provided to the inverter 2259 (the output of which is the CPN-PU signal, which transitions from "VDD" to "0"). The transistor 223a then starts charging CPN from "0" to "VDD". In this regard, when the charging is complete, the output of the inverter 2253 transitions from "VDD" to "0". Accordingly, because the top input of the logic NAND gate 2257 is now at "0", the output of the logic NAND gate 2257 transitions from "0" to "VDD". Then, after the output signal traverses inverters 2258 and 2259, the resulting CPN-PU signal transitions from "0" to "VDD", thereby releasing the transistor 223a and completing the CPN high phase.

Further, according to an embodiment, the operation of the clock distribution circuit 12/22 is as follows. At an initial state, CPout is at "0", CP is at "0", CPN is at "1", CP-PU is at "1", CP-PD is at "1", CPN-PD is at "0", and CPN-PU is at "0". Then, after CPout transitions from "0" to "1", the PCFB circuit 224 and the NCFB circuit 225 simultaneously (by configuration since they are matched in the propagation delay) perform the following: (1) the PCFB circuit 224 transitions CP-PD from "1" to "0" and (2) the NCFB circuit 225 transitions CPN-PU from "0" to "1". Then, shortly after, the master timing block 221 simultaneously (1) transitions CP-PU from "1" to "0" and (2) transitions CPN-PD from "0" to "1". Then, as CP and CPN will start to change—CP transitions from "0" to "1" (being pulled up by the PMOS transistor 222a) and CPN transitions from "1" to "0" (being pulled low by the NMOS transistor 223b). According to an embodiment, CP and CPN finish their transitions around roughly the same time. After which, CPout transitions back to "0", which causes the PCFB circuit 224 and the NCFB circuit 225 to reset their respective outputs. In this regard, the PCFB circuit 224 makes its CP-PD output high, which brings CP back to "0", and the NCFB circuit 225 makes its CPN-PU output high, which brings CPN back to "1".

According to an embodiment, since the transistors that did the pull up and pull down are matched in their configuration, and the timing blocks T, PCFB, and NCFB are configured to have equal delays (as mentioned in the steps above), it's guaranteed that the transition times of CP/CPN are the same. Therefore, and since also CP and CPN were created from the same input pulse CPout, they have the same width (duration of '1' for CP, duration of '0' for CPN). Since they have the same transition times and widths, they are fully complementary, i.e. perfectly aligned in time, but just have opposite values.

Figure 5:
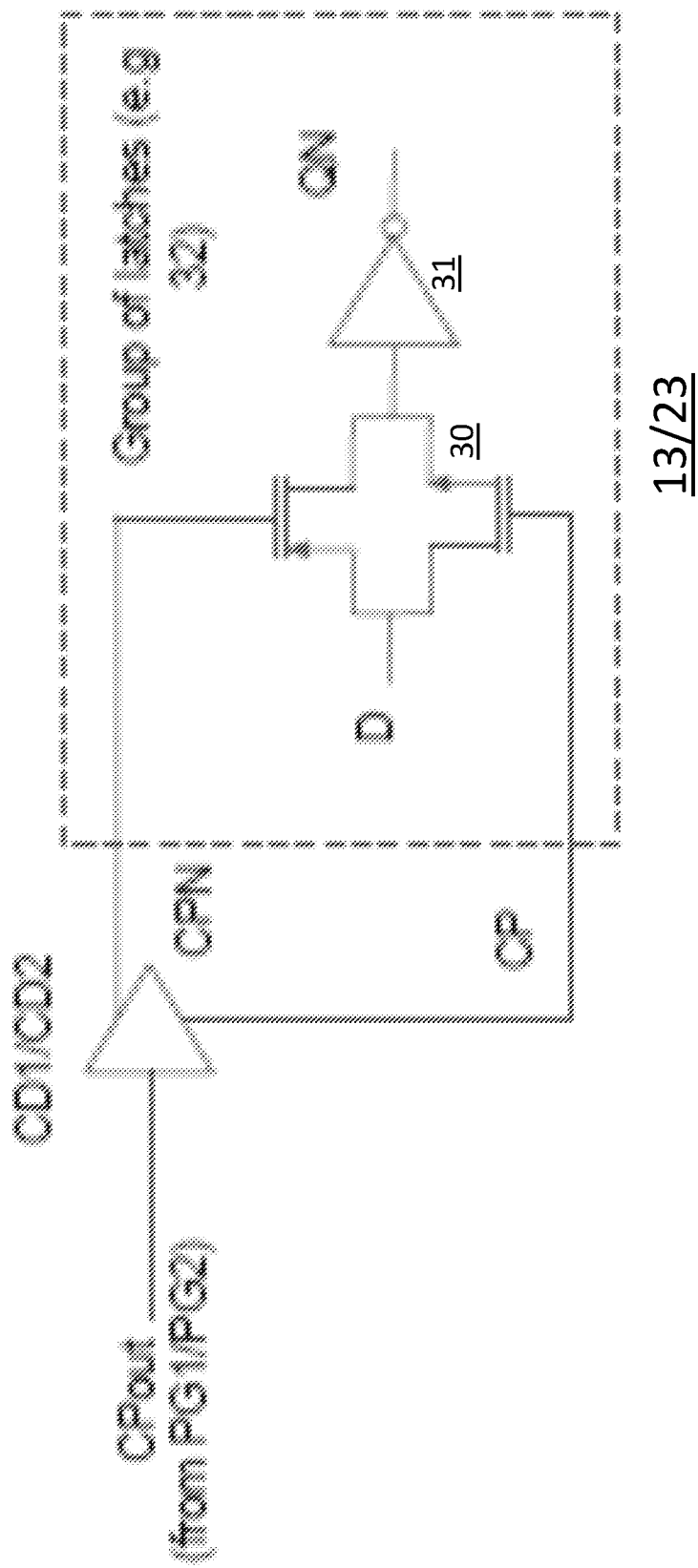
FIG. 5 depicts an exemplary latch group according to an embodiment of the invention.

FIG. 5 illustrates an exemplary group/set of latches according to an embodiment of the invention. As depicted in the figure, the set of latches 13/23 receive the CP and CPN signals provided by the clock distribution circuit CD1/CD2. In this regard, the set of latches 13/23 can include at least one transmission gate 30 and a corresponding inverter 31. According to an embodiment, each transmission gate 30 comprises of: (a) one PMOS transistor and (b) one NMOS transistor. Further, the inverter 31 can be connected between an internal latch node and the output QN. Further, according to an embodiment, the CP signal can connect to the gate of the NMOS transistor and the CPN signal can connect to the gate of the PMOS transistor. As such, the sets of latches 13/23 do not need to include a CPN inverter.

According to an embodiment, the sets of latches, e.g., first set of latches 13, second set of latches 23, etc., form a shift register, where Q1=D2, Q2=D3, etc.

According to an embodiment, the CP signal and CPN signal of one stage, e.g., the first core stage 10, arrive after the CP signal and CPN signal of the subsequent stage, e.g., the second core stage 20. In this regard, the CP and CPN signals of adjacent stages, e.g., the first core stage 10 and the second core stage 20, do not overlap.

It is to be understood that the above described embodiments are merely illustrative of numerous and varied other embodiments which may constitute applications of the principles of the invention. Such other embodiments may be readily devised by those skilled in the art without departing from the spirit or scope of this invention and it is our intent they be deemed within the scope of our invention.

The foregoing detailed description of the present disclosure is to be understood as being in every respect illustrative and exemplary, but not restrictive, and the scope of the present disclosure provided herein is not to be determined solely from the detailed description, but rather from the claims as interpreted according to the full breadth and scope permitted by patent laws. It is to be understood that the embodiments shown and described herein are merely illustrative of the principles addressed by the present disclosure and that various modifications may be implemented by those skilled in the art without departing from the scope and spirit of the present disclosure. Those skilled in the art may implement various other feature combinations without departing from the scope and spirit of the present disclosure. The various functional modules shown are for illustrative purposes only, and may be combined, rearranged and/or otherwise modified.

The invention claimed is:
1. An application-specific integrated circuit (ASIC) core, the ASIC core comprising:
   a plurality of core stages, each core stage comprising:
      a pulse generator, wherein the pulse generator is configured to (i) receive a clock pulse input and a plurality of digital inputs and (ii) generate a clock pulse output based on the received clock pulse input and the digital inputs;
a clock distribution circuit, wherein the clock distribution circuit is configured to receive the clock pulse output and generate a clock pulse signal and a clock pulse complement signal concurrently based on the received clock pulse output; and
a set of latches, wherein the set of latches is configured to receive the clock pulse signal and the clock pulse complement signal;
wherein each of the pulse generators are connected in cascade and implement reverse and non-overlapping clock pulses.

2. The ASIC core of claim 1, wherein the clock pulse signals and the clock pulse complement signals of adjacent core stages do not overlap.

3. The ASIC core of claim 1, wherein each of the pulse generators comprises:
a state element, a logic AND gate, and a first delay element.

4. The ASIC core of claim 3, wherein the first delay element comprises:
a plurality of inverters and a multiplexer.

5. The ASIC core of claim 1, wherein the clock distribution circuit comprises:
a first inverter, a second inverter, a positive current feedback (PCFB) circuit, and a negative current feedback (NCFB) circuit.

6. The ASIC core of claim 5, wherein the first inverter comprises a first p-channel metal-oxide semiconductor (PMOS) transistor and a first n-channel metal-oxide semiconductor (NMOS) transistor; and wherein the second inverter comprises a second PMOS transistor and a second NMOS transistor.

7. The ASIC core of claim 5, wherein the PCFB circuit comprises a transmission gate, a first logic NAND gate, and a first logic NOR gate; and wherein the NCFB circuit comprises a tri-state inverter, a second logic NAND gate, and a second logic NOR gate.

8. The ASIC core of claim 1, wherein each of the set of latches comprises at least one transmission gate and a corresponding inverter.

9. The ASIC core of claim 8, wherein the at least one transmission gate comprises a p-channel metal-oxide semiconductor (PMOS) transistor and a n-channel metal-oxide semiconductor (NMOS) transistor.

10. The ASIC core of claim 1, wherein the clock pulse signal connects to a clock pulse port in the set of latches and the clock pulse negative signal connects to a clock pulse negative port in the set of latches.

11. The ASIC core of claim 1, wherein the plurality of digital inputs are configured to set a pulse width of the clock pulse output.

* * * * *